United States Patent [19]

Lin

[11] Patent Number: 5,699,036

[45] Date of Patent: Dec. 16, 1997

[54] SHUNT

[76] Inventor: Muh-Jiun Lin, No. 26-1, Tung-Jun Rd., Pu-Li Chen, Nan-Tou, Hsien, Taiwan

[21] Appl. No.: 701,588

[22] Filed: Aug. 22, 1996

[51] Int. Cl.$^6$ .................................................. H04N 9/31
[52] U.S. Cl. .................................................................. 338/49
[58] Field of Search ............................ 338/49, 58–61, 338/230–235

[56] References Cited

U.S. PATENT DOCUMENTS 4,331,972  5/1982  Rajchman ............................ 358/60

*Primary Examiner*—Aditya Krishnan
*Attorney, Agent, or Firm*—Foley and Lardner

[57] ABSTRACT

A shunt includes an integrally formed, continuous elongated flat plate body with two contact end portions and a curved intermediate portion which links the contact end portions and which has a constant width. The plate body has a thickness of about 1 to 2 mm and is symmetrical with respect to an axis which extends between the contact end portions. The curved intermediate portion includes at least two parallel straight segments and at least one curved bridging segment that links adjacent ends of two of the straight segments. Adjacent ones of the straight segments form a distance of about 1 to 2 mm therebetween.

5 Claims, 5 Drawing Sheets

5,699,036

SHUNT

BACKGROUND OF THE INVENTION

1. Field of the Invention

The invention relates to a shunt, more particularly to a shunt which has excellent electrical characteristics within a relatively broad frequency range, which is easy to fabricate and install, and which is adapted for use in high precision instruments.

2. Description of the Related Art

Efficient power consumption can be achieved by reducing current use and by correcting the power factor. High precision instruments are important in devising ways to correct the power factor. Such instruments usually employ a shunt to increase the range of operation of the instrument.

FIGS. 1 and 2 illustrate two conventional shunts S1, S2 which are made by cutting and manually bending a manganese-copper alloy workpiece. It is noted that the electrical characteristics of a shunt depend on its configuration. Since the conventional shunts S1, S2 are manually formed and deform easily, it is difficult to form two identical shunts with exactly the same electrical characteristics. In addition, the conventional shunts S1, S2 are only suitable for use in low frequency (60 Hz to 400 Hz), purely sine wave current applications. When the current is not a pure sine wave or at frequencies higher than 1 kHz, the electrical characteristics of the conventional shunts S1, S2 change from resistive to inductive. In other words, the electrical characteristics of the conventional shunts S1, S2 deteriorate as the frequency increases, thereby making the conventional shunts S1, S2 unsuitable for use in high frequency or non-sine wave current applications. Moreover, since no two shunts S1, S2 are exactly alike, problems are usually encountered when the shunts S1, S2 are installed in an instrument, thereby affecting adversely the precision of the latter. Furthermore, it is difficult to connect the conventional shunts S1, S2 to a heat dissipating device so as to reduce the temperature of the shunts S1, S2 in high current applications.

FIG. 3 illustrates another conventional shunt S3 that is adapted for use in high precision instruments. Like the aforementioned conventional shunts S1, S2, the conventional shunt S3 occupies a relatively large amount of space and cannot be easily connected to a heat dissipating device.

SUMMARY OF THE INVENTION

Therefore, the object of the present invention is to provide a shunt which has excellent electrical characteristics within a relatively broad frequency range, which is easy to fabricate and install, and which is adapted for use in high precision instruments.

Accordingly, the shunt of the present invention includes an integrally formed, continuous elongated flat plate body with two contact end portions and a curved intermediate portion which links the contact end portions and which has a constant width. The plate body has a thickness of about 1 to 2 mm and is symmetrical with respect to an axis which extends between the contact end portions. The curved intermediate portion includes at least two parallel straight segments and at least one curved bridging segment that links adjacent ends of two of the straight segments. Adjacent ones of the straight segments form a distance of about 1 to 2 mm therebetween. The shunt of the present invention is suitable for use in high precision instruments having a DC to 100 kHz operating range.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Figure 1:
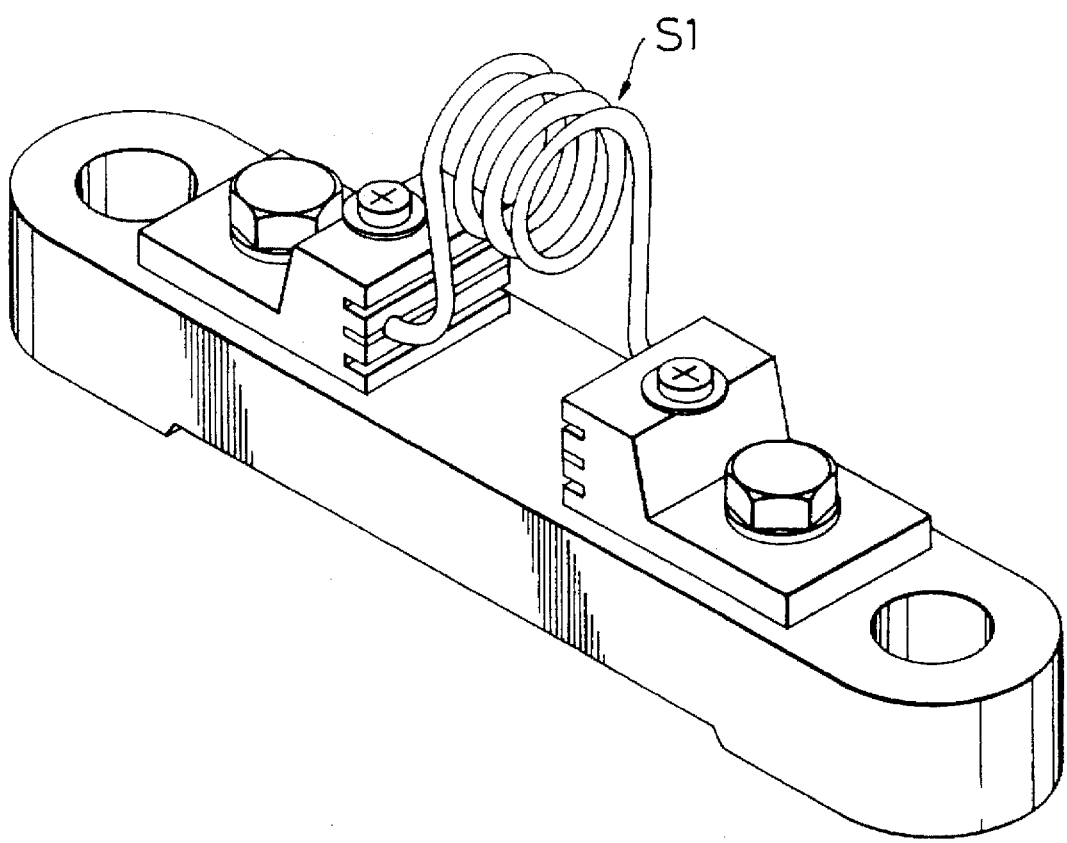
FIG. 1 is a perspective view of a conventional shunt.
Figure 2:
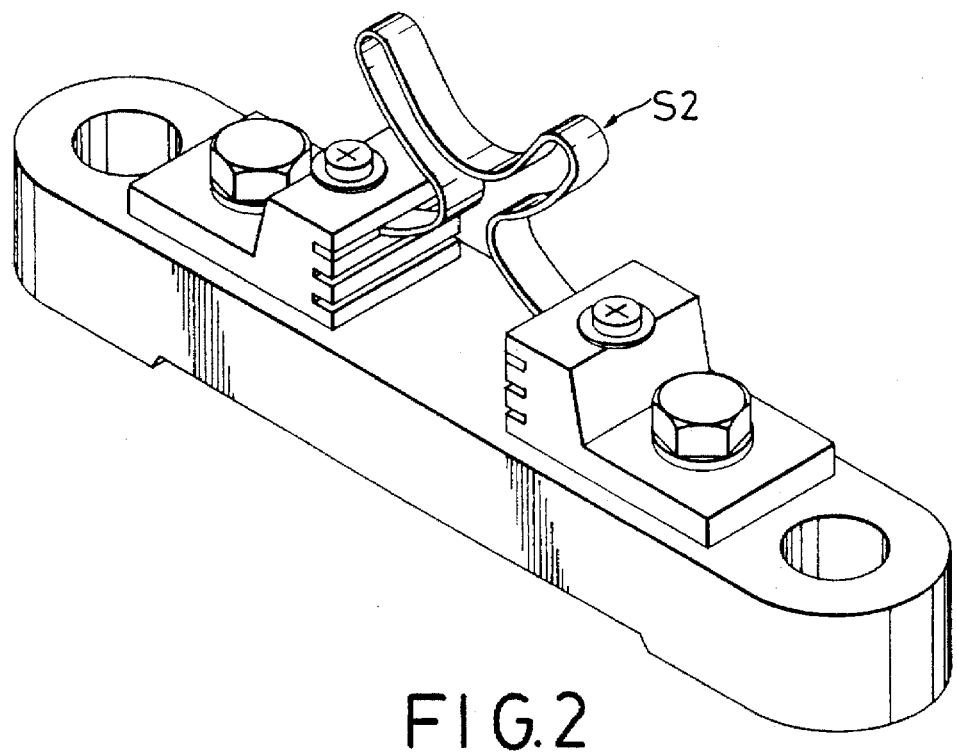
FIG. 2 is a perspective view of another conventional shunt.
Figure 3:
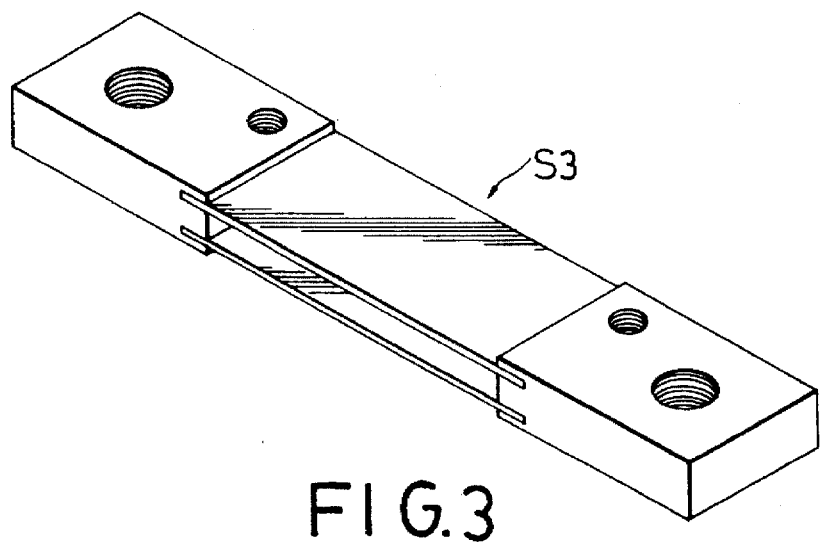
FIG. 3 is a perspective view of yet another conventional shunt.
Figure 4:
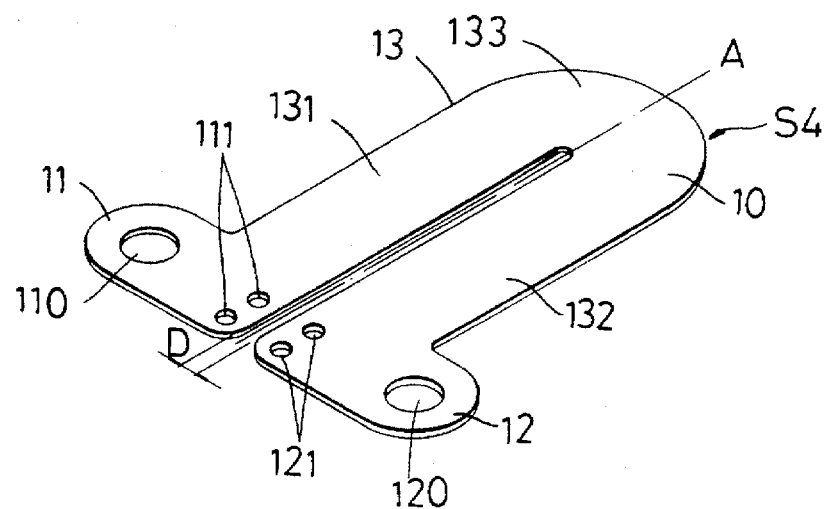
FIG. 4 is a perspective view of the first preferred embodiment of a shunt according to the present invention.

Referring to FIG. 4, the first preferred embodiment of a shunt S4 according to the present invention is shown to comprise an integrally formed, continuous elongated flat plate body 10 which is formed by cutting a manganese-copper alloy plate in a conventional manner, such as by punching the manganese-copper alloy plate in a mold. The plate body 10 has two contact end portions 11, 12 and a curved intermediate portion 13 which links the contact end portions 11, 12 and which has a constant width. The plate body 10 has a thickness of about 1 to 2 mm and is symmetrical with respect to an axis A which extends between the contact end portions 11, 12. In this embodiment, the curved intermediate portion 13 is substantially U-shaped and includes two parallel straight segments 131, 132 and a curved bridging segment 133 that links adjacent ends of the straight segments 131, 132. The straight segments 131, 132 form a distance D of about 1 to 2 mm therebetween.

Since the shunt S4 is not provided with sharp 90° corners, the magnetic lines of force can be neutralized to reduce the inductive characteristics of the shunt S4 and enable the latter to maintain its resistive characteristics and minimize its capacitive characteristics at high frequencies. In addition, the shunt S4 has minimal skin effect and stable electrical characteristics since the current path through the shunt S4 is fixed and since current can be equally distributed as it passes through the shunt S4.

The contact end portions 11, 12 are formed with mounting holes 110, 120 and soldering holes 111, 121 located between the mounting holes 110, 120. The mounting and soldering holes facilitate mounting of the shunt S4 to an instrument without affecting adversely the precision of the latter.

Figure 5:
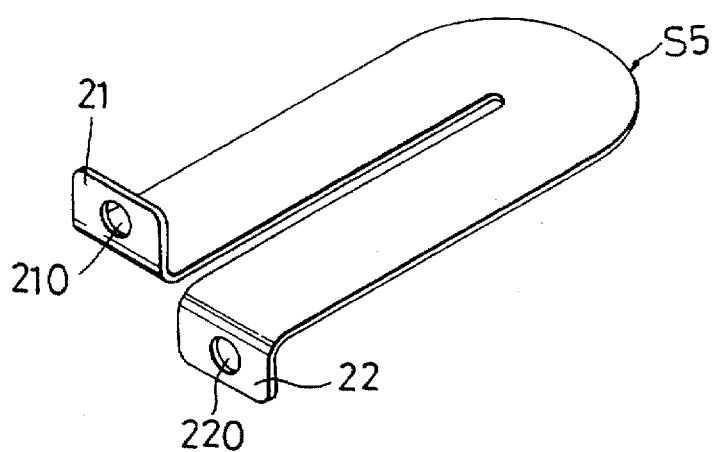
FIG. 5 is a perspective view of the second preferred embodiment of a shunt according to the present invention.

FIG. 5 shows the second preferred embodiment of a shunt S5 according to the present invention. The second preferred embodiment is substantially similar to the first preferred embodiment except that, in this embodiment, the contact end portions 21, 22 extend upward and downward respectively and only have one mounting hole 210, 220 formed therethrough. The arrangement of the contact end portions 21, 22 facilitate mounting of the shunt S5 on a printed circuit board (not shown).

Figure 6:
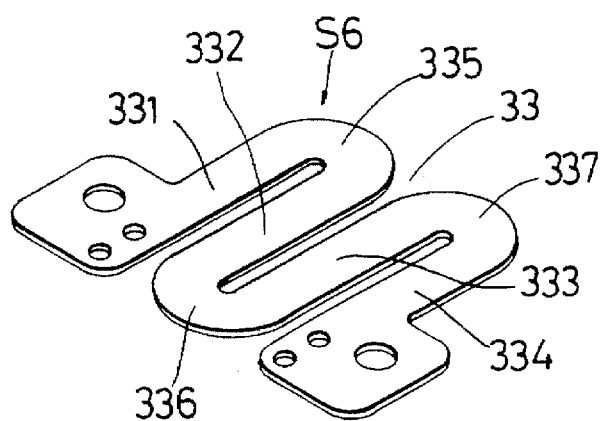
FIG. 6 is a perspective view of the third preferred embodiment of a shunt according to the present invention.

FIG. 6 shows the third preferred embodiment of a shunt S6 according to the present invention. In this embodiment, the curved intermediate portion 33 is substantially W-shaped and includes four parallel straight segments 331, 332, 333, 334 and three curved bridging segments 335, 336, 337 that link adjacent ends of the straight segments 331, 332, 333, 334.

Figure 7:
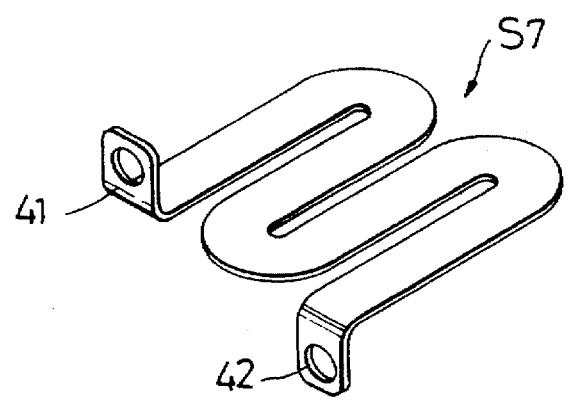
FIG. 7 is a perspective view of the fourth preferred embodiment of a shunt according to the present invention.

FIG. 7 shows the fourth preferred embodiment of a shunt S7 according to the present invention. The fourth preferred embodiment is substantially similar to the third preferred embodiment except that, in this embodiment, the contact end portions 41, 42 extend upward and downward like the embodiment shown in FIG. 5.

Figure 8:
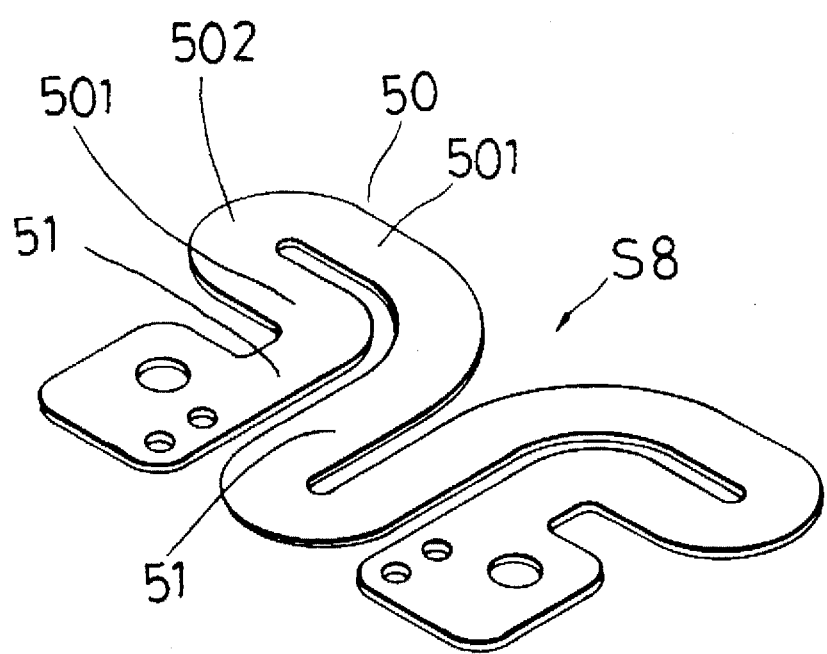
FIG. 8 is a perspective view of the fifth preferred embodiment of a shunt according to the present invention.

FIG. 8 illustrates the fifth preferred embodiment of a shunt S8 according to the present invention. In this embodiment, there are two curved bridging segments 50 which link adjacent ends of two straight segments 51, respectively. Each curved bridging segment 50 includes two parallel parts 501 and a curved part 502 which links the parallel parts 501. The parallel parts 501 form a distance of about 1 to 2 mm therebetween.

The advantages and characterizing features of the shunt of the present invention are as follows:

1. The physical properties of individual shunts can be kept the same. Since the present invention can be conveniently formed by cutting a manganese-copper alloy plate, the shape, length and size of the shunts can be kept equal, thereby resulting in identical characteristics. In addition, the shunt does not deform easily and is suitable for mass-production, thus resulting in a lower component cost.

2. In view of the improved electrical characteristics of the shunt, the present invention is ideal for use in 4½ digit and above high precision instruments, such as watt meters, power analyzers, power harmonic analyzers, power recorders and the like, that operate in the range of DC to 100 kHz.

3. The presence of the mounting and soldering holes in the contact end portions of the shunt facilitate accurate and precise mounting of the present invention to an instrument.

4. The flat configuration of the present invention results in a relatively small volume and facilitates connection of the same to another device, such as a heat dissipating device.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A shunt comprising an integrally formed, continuous elongated flat plate body with two contact end portions and a curved intermediate portion which links said contact end portions and which has a constant width, said plate body having a thickness of about 1 to 2 mm and being symmetrical with respect to an axis which extends between said contact end portions, said curved intermediate portion including at least two parallel straight segments and at least one curved bridging segment that links adjacent ends of two of said straight segments, adjacent ones of said straight segments forming a distance of about 1 to 2 mm therebetween.

2. The shunt as claimed in claim 1, wherein said curved intermediate portion is substantially U-shaped.

3. The shunt as claimed in claim 1, wherein said curved intermediate portion is substantially W-shaped.

4. The shunt as claimed in claim 1, wherein each of said curved bridging segments includes two parallel parts and a curved part linking said parallel parts, said parallel parts forming a distance of about 1 to 2 mm therebetween.

5. The shunt as claimed in claim 1, wherein said plate body is formed by cutting a manganese-copper alloy plate.

* * * * *